United States Patent
Yun et al.

(10) Patent No.: US 7,800,345 B2
(45) Date of Patent: Sep. 21, 2010

(54) BATTERY MANAGEMENT SYSTEM AND METHOD OF OPERATING SAME

(75) Inventors: Han-Seok Yun, Yongin-si (KR); Young-Jo Lee, Yongin-si (KR); Se-Wook Seo, Yongin-si (KR); Gye-Jong Lim, Yongin-si (KR); Beom-Gyu Kim, Yongin-si (KR); Soo-Seok Choi, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 727 days.

(21) Appl. No.: 11/736,832

(22) Filed: Apr. 18, 2007

(65) Prior Publication Data

US 2007/0262750 A1    Nov. 15, 2007

(30) Foreign Application Priority Data

May 12, 2006    (KR)    ........................ 10-2006-0042897

(51) Int. Cl.
*H02J 7/00*    (2006.01)
*G01N 27/416*    (2006.01)
*G08B 21/00*    (2006.01)

(52) U.S. Cl. .................. 320/132; 320/134; 324/426; 340/636.12; 340/636.21; 340/636.1

(58) Field of Classification Search .................. 320/132, 320/134
See application file for complete search history.

(56) References Cited

U.S. PATENT DOCUMENTS

| | | | | |
|---|---|---|---|---|
| 6,160,380 A | * | 12/2000 | Tsuji et al. | ................... 320/132 |
| 6,366,054 B1 | * | 4/2002 | Hoenig et al. | ............... 320/132 |
| 2004/0257087 A1 | * | 12/2004 | Murakami | ................... 324/426 |
| 2006/0066285 A1 | * | 3/2006 | Minamiura | ................. 320/132 |

FOREIGN PATENT DOCUMENTS

| | | |
|---|---|---|
| JP | 09-070146 | 3/1997 |
| JP | 2002-189066 | 7/2002 |
| KR | 2004-15242 | 2/2004 |
| KR | 2006-116724 | 11/2006 |
| WO | WO 02/091007 | 11/2002 |

\* cited by examiner

*Primary Examiner*—Edward Tso
*Assistant Examiner*—Yalkew Fantu
(74) *Attorney, Agent, or Firm*—Christie, Parker & Hale, LLP (57) ABSTRACT

A battery management system and a method of operating the same includes a plurality of battery cells constituting one pack and connected to a battery having at least one pack, and determines an estimated state of charge (SOC) of the battery. The battery management system determines whether or not a pack current flows, and controls a reset of an SOC depending on the determination result. The battery management system sets an OCV idle period associated with a temperature of the battery, and compares the idle period with a time for which the current of the battery does not flow, and sets the reset OCV depending on the comparison result. The battery management system resets the estimated SOC as the reset SOC associated with the reset OCV.

20 Claims, 4 Drawing Sheets

BATTERY MANAGEMENT SYSTEM AND METHOD OF OPERATING SAME

CROSS-REFERENCE TO RELATED APPLICATION

This application claims the benefit of Korean Application No. 2006-42897, filed May 12, 2006 in the Korean Intellectual Property Office, the disclosure of which is incorporated herein by reference.

BACKGROUND OF THE INVENTION

1. Field of the Invention

Aspects of the present invention relate to a battery management system. More particularly, aspects of the present invention relate to a state of charge (SOC) reset method usable in a vehicle using electrical energy, and a battery management system using the same.

2. Description of the Related Art

Many vehicles have an internal combustion engine that uses gasoline or heavy oil as a main fuel. Such vehicles have a serious influence on the generation of environmental pollution. Examples of such pollution include air pollution. In recent years, much effort has been made to develop an electric vehicle or a hybrid vehicle to reduce the generation of environmental pollution.

An electric vehicle refers to a vehicle using a battery engine that operates on electrical energy output from a battery. As a main power source, the electric vehicle uses a battery in which a plurality of rechargeable secondary cells is provided as one pack. Accordingly, the electric vehicle is advantageous in that no discharge gas is produced, and noise that is produced is very small.

A hybrid vehicle refers to an intermediary vehicle between the vehicle using an internal combustion engine and the electric vehicle using an electric motor as an engine. The hybrid vehicle uses two or more power sources, which include an internal combustion engine and the electric motor. Currently, a type of the hybrid vehicle that uses an internal combustion engine and a fuel cell is being developed. The fuel cell directly obtains electrical energy from an induced chemical reaction of a continuously supplied hydrogen and oxygen. Another type of the hybrid vehicle uses a battery and a fuel cell.

In the electric or the hybrid vehicle that uses the electrical energy, performance of the battery has a direct influence on the performance of the vehicle. Thus, not only should each battery cell have excellent performance, but each battery cell should also have a battery management system (BMS) to measure a voltage of each battery cell, and a voltage and a current of a whole battery. Accordingly, a way to effectively manage charge and discharge of each battery cell is seriously required.

Particularly, when an initial state of charge (SOC) is to be reset in estimating a state of charge (SOC) of the battery, an open circuit voltage (OCV) is measured upon a key-on state, and the initial SOC is reset using a relation table of the SOC relative to the OCV.

To reset the SOC, the battery must not have been charging and discharging for a predetermined time so that the OCV could be measured. The SOC associated with the measured OCV is then calculated, to thereby reset the initial SOC. When the battery has not been charged and discharged for a predetermined time, the OCV is reset once the chemical reaction in the battery is stabilized and the voltage does not change. Once the OCV is reset, the SOC associated with a reset value of the OCV is calculated, and the estimated SOC is obtained using the calculated SOC.

However, in a related art, a waiting time necessary to reset the OCV, which is a time when the battery is not charged and discharged, is set irrespective of a state of the battery. In some cases, the OCV cannot be reset because the charge and discharge may begin before the waiting time expires. Accordingly, the SOC also cannot be reset, and causes problems in exactly calculating the SOC.

SUMMARY OF THE INVENTION

Aspects of the present invention includes a battery management system and a method of operating the same having advantages of resetting an open circuit voltage (OCV) depending on a state of a battery, and resetting a state of charge (SOC) using the reset OCV.

An aspect of the present invention includes a battery management system to determine an estimated state of charge (SOC) of a battery. The system includes: a sensor to sense a voltage, a current, and a temperature of the battery; a controller to determine whether or not the pack current flows, and to control a reset of an SOC depending on the determination result; an idle period decider to set an open circuit voltage (OCV) idle period associated with the temperature of the battery, in response to an activation command of the controller; and an SOC reset unit to compare the set idle period with a time for which the current of the battery does not flow, in response to the activation command of the controller, to set a reset OCV depending on the comparison result, and to reset the estimated SOC as a reset SOC associated with the reset OCV.

The idle period decider includes a data table of the temperature of the battery and the OCV idle period, and detects the OCV idle period associated with the temperature of the battery, from the data table. The data table sets as the reset OCV an OCV measured at a predetermined temperature of the battery when a predetermined time lapses in a state where the current of the battery does not flow, and includes information on the reset OCV associated with the temperature of the battery. The data table sets an OCV associated with an SOC having a tolerance of 1% of the SOC associated with the measured OCV, as the reset OCV.

The controller transmits the activation command to the SOC reset unit and the idle period decider to reset the SOC when it is determined that the current of the battery does not flow. The SOC reset unit sets the voltage of the battery as the reset OCV when the time for which the current of the battery does not flow is equal to or more than the idle period, and sets the SOC associated with the reset OCV as the reset SOC. The SOC reset unit stores data on the OCV and the SOC, and detects the reset SOC associated with the reset OCV, from the data.

The battery management system further includes an estimation SOC decider for calculating the estimated SOC. The estimation SOC decider accumulates the current of the battery, and calculates the estimated SOC.

Another aspect of the present invention provides a method of operating a battery management system having a plurality of battery cells constituting one pack, and determining an estimated SOC of a battery having at least one pack. The method includes: measuring a temperature of the battery, and determining whether or not an electric current of the battery flows; when it is determined that the current of the battery does not flow in the measuring of the temperature of the battery, detecting an open circuit voltage (OCV) idle period associated with the temperature of the battery; measuring a time for which the current of the battery does not flow, and comparing the measured time with the OCV idle period; when it is determined that the time for which the measured current of the battery does not flow is equal to or more than the OCV idle period in the measuring the time, setting a voltage of the battery as a reset OCV; and detecting an SOC associated with the reset OCV, and resetting the estimated SOC using the detected SOC.

In the detecting of the OCV idle period, the OCV idle period associated with the temperature of the battery is detected from a data table of the temperature of the battery and the OCV idle period. The data table sets as the reset OCV an OCV measured at a predetermined temperature of the battery when a predetermined time lapses in a state where the current of the battery does not flow, and includes information on the reset OCV associated with the temperature of the battery. The data table sets an OCV associated with an SOC having a tolerance of 1% of the SOC associated with the measured OCV, as the reset OCV.

Yet another aspect of the present invention includes battery management system to output an estimated state of charge (SOC) of a battery to a motor control unit (MTCU) of a vehicle. The system includes a sensor to sense a current, a voltage, and a temperature of the battery; a main control unit (MCU) to reset the estimated SOC using the current, the voltage, and the temperature received from the sensor, and to control a charge and discharge of the battery; and a communication unit to transmit the SOC outputted from the MCU, to the MTCU, and to receive running information of the vehicle from the MTCU.

The MCU includes a controller to receive the running information of the vehicle, and when the vehicle is in a key-on state or a constant velocity state, determining whether or not the current of the battery flows, and controlling a reset of the SOC depending on the determination result; an idle period decider to set an OCV idle period associated with the temperature of the battery, in response to an activation command of the controller; and an SOC reset unit to compare the set idle period with a time for which the current of the battery does not flow, in response to the activation command of the controller, and to set a reset OCV depending on the comparison result, and to reset the estimated SOC as a reset SOC associated with the reset OCV. The idle period decider includes a data table of the temperature of the battery and the OCV idle period, and detects the OCV idle period associated with the temperature of the battery, from the data table. The data table sets as the reset OCV an OCV measured at a predetermined temperature of the battery when a predetermined time lapses in a state where the current of the battery does not flow, and includes information on the reset OCV associated with the temperature of the battery.

According to an aspect of the present invention, a battery management method to determine a state of charge of a rechargeable battery includes: detecting an amount of time the rechargeable battery has been idle; detecting a temperature and a voltage of the rechargeable battery; obtaining a predetermined minimum idle time to stabilize the rechargeable battery that corresponds to the detected temperature of the rechargeable battery; determining whether the detected rechargeable battery idle time is greater than or equal to the minimum idle time; setting the detected voltage of battery as a present open circuit voltage of the rechargeable battery based on the determination that the detected rechargeable battery idle time is greater than or equal to the minimum idle time; and setting the state of charge of the rechargeable battery that corresponds to the detected voltage as the present state of charge of the rechargeable battery.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Reference will now be made in detail to the aspects of the present invention, examples of which are illustrated in the accompanying drawings, wherein like reference numerals refer to the like elements throughout. The aspects are described below in order to explain the present invention by referring to the figures.

Aspects of the present invention include a battery management system and a method of operating the same, to reset an open circuit voltage (OCV) depending on a state of a battery, and to reset a state of charge (SOC) using the reset OCV so that the SOC of the battery is more accurately obtained based on a present state of the battery.

Throughout the whole specification, "connecting" any part with another part not only includes "directly connecting", but also includes "electrically connecting" with a different constituent element interposed therebetween. Also, "including" a constituent element in a part signifies further including, not excluding, another constituent element if there is no specific reference to the contrary.

Figure 1:
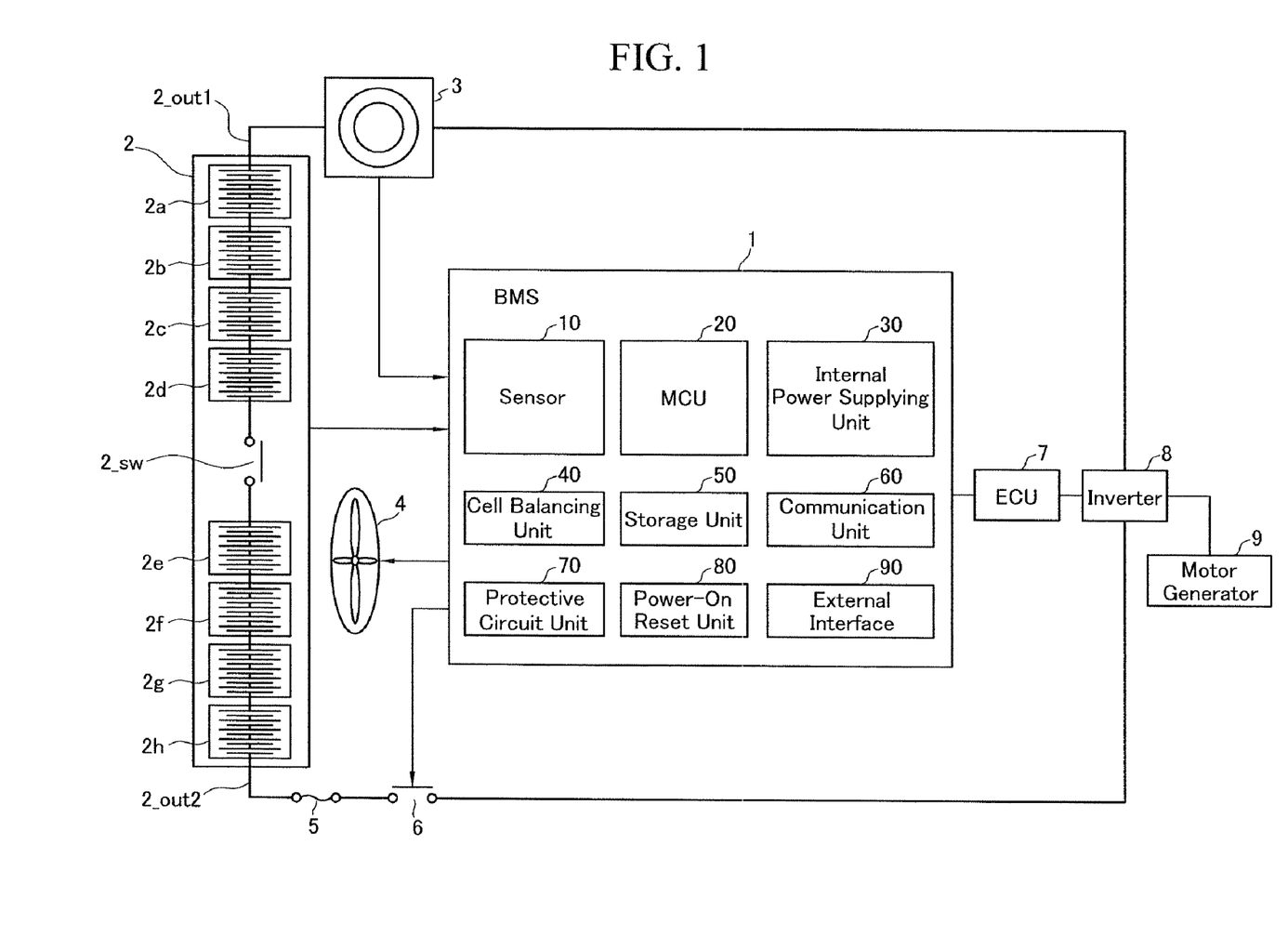
FIG. 1 is a schematic diagram illustrating a vehicle system using a battery management system (BMS) according to an aspect of the present invention.

FIG. 1 is a schematic diagram illustrating a vehicle system using a battery management system (BMS) according to an aspect of the present invention. As shown in FIG. 1, the vehicle system includes the BMS 1, a battery 2, an electric current sensor 3, a cooling fan 4, a fuse 5, a main switch 6, a motor control unit (MTCU) 7, an inverter 8, and a motor generator 9.

More specifically, the battery 2 includes: a plurality of sub-packs 2a to 2h in which a plurality of battery cells (not shown) are coupled in series; output terminals (2_OUT1 and 2_OUT2); and a safety switch (2_SW) provided between the sub-pack 2d and the sub-pack 2e. The sub-packs 2a to 2h are shown as being eight in number, as an example, but the number and the arrangement of the sub-packs 2a to 2h are shown to simply express the fact that the plurality of battery cells 2a to 2h are in one group, and are not intended to limit the scope of the present invention.

In various aspects, the battery 2 also includes the safety switch (2_SW) that refers to a switch provided between the sub-pack 2d and the sub-pack 2e. The safety switch (2_SW) can be manually switched on/off for the sake of safety when the battery is replaced or work is performed on the battery. In a non-limiting aspect of the present invention, the safety switch (2_SW) is provided between the sub-pack 2d and the sub-pack 2e. The output terminals (2_OUT1 and 2_OUT2) connect to the inverter 8.

The electric current sensor 3 measures an amount of electric current output from the battery 2, and also outputs the measured current amount to a sensor 10 of the BMS 1. In a non-limiting example, the electric current sensor 3 can be a Hall current transformer (CT) to measure the current using a Hall device and to output an analog current signal associated with the measured current. In various aspects, other types of electric current sensors may be used.

The cooling fan 4 dissipates heat caused by a charge and discharge of the battery 2 based on a control signal of the BMS 1. The cooling fan 4 prevents the battery 2 from being degenerated due to an increase in the temperature of the battery 2, and also prevents the efficiency of the charge and discharge of the battery from being reduced.

The fuse 5 disconnects or short-circuits the battery 2 to prevent an overcurrent from being transmitted to the battery 2. In other words, when the overcurrent is generated, the fuse 5 is disconnected to prevent the overcurrent from being transmitted to the battery 2.

Also, when an abnormal overvoltage, overcurrent, or high temperature (overheating) occurs, the main switch 6 switches on/off the battery 2 based on the control signal of the BMS 1 or the MTCU 7 of the vehicle to disconnect the battery 2 from the inverter 8, for example.

In various aspects, the BMS 1 includes the sensor 10, a main control unit (MCU) 20, an internal power supplying unit 30, a cell balancing unit 40, a storage unit 50, a communication unit 60, a protective circuit 70, a power-on reset unit 80, and an external interface 90.

The sensor 10 senses and transmits an entire (or overall) battery pack current (hereinafter, referred to as "pack current" (Ip)), an entire (or overall) battery pack voltage (hereinafter, referred to as "pack voltage" (Vp)), an entire (or overall) pack temperature (Tp), a cell peripheral temperature, and/or the like, to the MCU 20.

The MCU 20 generates information to estimate the SOC and a state of health (SOH) of the battery 2 based on the pack current (Ip), the pack voltage (Vp), the pack temperature (Tp), and/or the peripheral temperature received from the sensor 10, and informs of (or provides) the state information of the battery 2. It is preferable, but not required, that the MCU 20 sets (or determines) an OCV idle period based on the pack temperature (Tp) received from the sensor 10, and so that once the OCV idle period lapses, the OCV is reset. The MCU 20 then calculates (or determines) the SOC based on the reset value of the OCV and sets the calculated (or determined) SOC as the reset value of the SOC. Thereafter, the estimated SOC is reset based on the calculated SOC reset value.

That is, during operation, the MCU 20 resets the SOC based on a state of the vehicle. More specifically, the MCU 20 resets the SOC based on information on the state of the vehicle received from the MTCU 7 through the communication unit 60. Depending on whether the vehicle state is in a key-on state and/or a uniform velocity state, the MCU 20 determines whether the OCV idle period has lapsed, and resets the SOC.

Referring back to FIG. 1, in various aspects, the internal power supplying unit 30 supplies power to the BMS 1 using a sub battery or a separate battery. The cell balancing unit 40 balances the state of charge of each cell 2a-2h. In other words, the cell balancing unit 40 can discharge a cell of a relatively high charged state, and can charge a cell of a relatively low charged state. Also, the storage unit 50 stores data of the SOC and SOH when the BMS 1 is in a power-off state. The storage unit 50 can be a nonvolatile storage unit, such as an electrically erasable programmable read only memory (EEPROM). The communication unit 60 communicates with the MTCU 7 of the vehicle. The communication unit 60 transmits information of the SOC and the SOH from the BMS 1 to the MTCU 7, or receives information on the state of the vehicle from the MTCU 7 and transmits the received information to the MCU 20.

The protective circuit 70 protects the battery 2 from external impact, overcurrent, and low voltage, using a firmware. The power-on reset unit 80 resets the entire system when the BMS 1 is in a power-on state (or being turned on). The external interface 90 connects sub devices of the BMS 1, such as the cooling fan 4 and the main switch 6, to the MCU 20. In the non-limiting aspect shown, only the cooling fan 4 and the main switch 6 are shown. However, it is understood that the scope of the present invention is not limited thereto as there are other sub devices in a vehicle which may be connected to the BMS 1.

During operation, the MTCU 7 detects an in-running state (or the operating state) of the vehicle based on such information as the state of an accelerator, a brake, and a speed of the vehicle, and decides (or determines) usable information such as a degree of torque. The in-running state of the vehicle refers to the key-on state to start the engine, the key-off state to stop the engine, the constant velocity state when the velocity of the vehicle is constant, an acceleration running state when the vehicle is accelerating, and/or the like. The MTCU 7 transmits the information on the various vehicle states to the communication unit 60 of the BMS 1. The MTCU 7 controls the motor generator 9 to generate an output drive based on torque information. In other words, the MTCU 7 controls a switching of the inverter 8, and controls the motor generator 9 to generate the output drive based on the torque information.

Also, the MTCU 7 receives the SOC of the battery 2 from the MCU 20 through the communication unit 60 of the BMS 1, and controls the SOC of the battery 2 to reach a target value (e.g., 55%). In a non-limiting example, receiving information that an SOC is at 55% or less from the MCU 20 causes the MTCU 7 to control the switch of the inverter 8 to output power toward the battery 2 to charge the battery 2. While the battery 2 is charged, the pack current (Ip) has a positive (+) value. On the other hand, receiving information that an SOC is at 55% or more causes the MTCU 7 to control the switch of the inverter 8 to output the power toward the motor generator 9 to discharge the battery 2. When the battery 2 is being discharged, the pack current (Ip) has a negative (−) value. It is understood that the target value of the SOC to charge and discharge the battery 2 may be any value.

The inverter 8 enables the battery 2 to be charged or discharged based on the control signal of the MTCU 7. The motor generator 9 drives the vehicle based on the torque information received from the MTCU 7, using the electrical energy of the battery 2. As a result, the MTCU 7 charges and discharges the battery 2 as much as an allowable rechargeable power limit of the batter 2 based on the SOC. Accordingly the battery 2 is prevented from being overcharged and overdischarged and is enabled to be efficiently used for a long time.

Nevertheless, when the battery 2 is installed in the vehicle, the difficulty in measuring an actual SOC of the battery 2 is increased. Therefore, the BMS 1 estimates the SOC using the pack current (Ip), the pack voltage (Vp), the pact temperature Tp, the peripheral temperature, the cell temperature, and/or the like, sensed by the sensor 10, according to an aspect of the present invention, and transmit the estimated SOC to the MTCU 7.

Hereinafter, the MCU 20 that more accurately estimates and outputs the SOC will be described in detail below.

Figure 2:
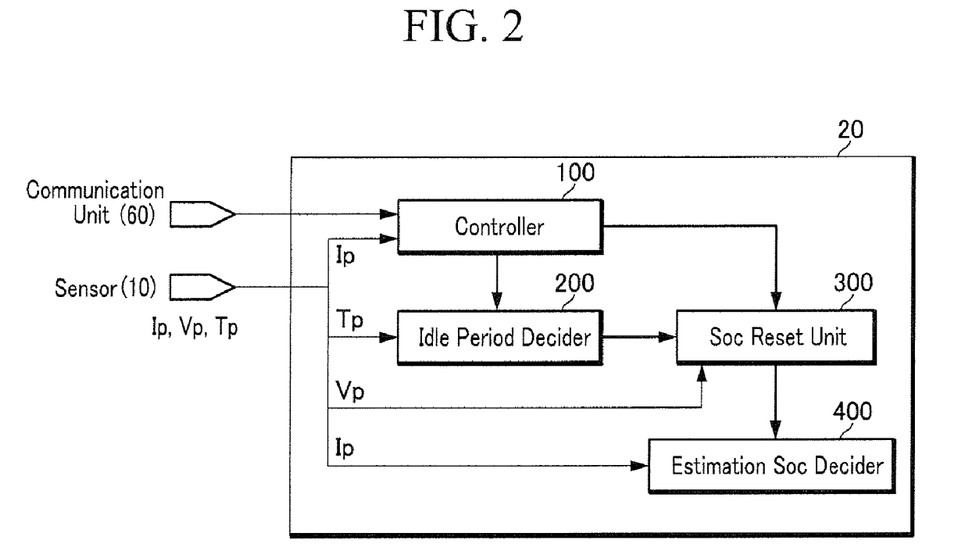
FIG. 2 is a schematic diagram illustrating a main control unit (MCU) of a BMS according to an aspect of the present invention.

FIG. 2 is a schematic diagram illustrating the MCU 20 of the BMS 1 according to an aspect of the present invention. As shown in FIG. 2, the MCU 20 includes a controller 100, an idle period decider 200, an SOC reset unit 300, and an estimation SOC decider 400.

During operation, when a charge and/or discharge current do not flow (or no longer flows), the controller 100 controls the idle period decider 200 and the SOC reset unit 300 in order to reset the SOC. The charge and discharge current may not flow when the state of the vehicle is in the key-on state or in the constant velocity state. In other words, the controller 100 receives information on the in-running state of the vehicle from the communication unit 60, and controls the resetting of the SOC based on the type of the running state of the vehicle. Accordingly, the operation begins when the present state of the vehicle is in the key-on state or the constant velocity state, and the controller 100 determines whether the pack current (Ip) flows. When the pack current (Ip) does not flow, which may be the case when the pack current (Ip) is equal to zero amperes (OA), the controller 100 transmits an operation signal (a start operation signal) to the idle period decider 200 and the SOC reset unit 300. Thereafter, the controller 100 enables a timer once the pack current (Ip) is (or is detected as) equal to 0 amperes, and measures a time (Pr) (battery idle time or period) during which the charge and discharge current is not generated (i.e., the battery 2 is not charged and/or discharged). Then, the controller 100 transmits the result (time (Pr)) to the SOC reset unit 300.

After receiving the operation signal from the controller 100, the idle period decider 200 receives the pack temperature (Tp) from the sensor 10, and determines (detects or obtains) an OCV idle period that corresponds to the received pack temperature (Tp). In various aspects, the OCV idle period refers to a time period that is necessary to stabilize the OCV of the battery once charging and discharging of the battery ceases. In a non-limiting example, the idle period decider 200 stores data in various forms, such as a table (or a layout), of the OCV idle period of the battery that corresponds to one or more temperatures of the battery. Based on the data, once the OCV idle period is determined for the detected pack temperature (Tp), the idle period decider 200 transmits the result to the SOC reset unit 300, so that the battery idle time (Pr) and the OCV idle period (for the detected pack temperature (Tp)) is brought together in the SOC reset unit 300.

In various aspects, the data table (or layout) of the OCV idle period relative to the pack temperature (Tp) of the battery is predetermined, for example, by experiment. The experiment measures the OCV at various predetermined temperatures of the battery 2 after a predetermined time lapses while the battery is not charged and discharged, so that the pack current (Ip) does not flow during the measuring of the OCV. The measured OCV can be used as a reset OCV in the data table of the OCV that corresponds to predetermined temperatures of the battery 2.

When the SOC is correlated to the reset OCV, the SOC is provided to have a tolerance (or a margin of error) of 1% relative to the reset OCV in an aspect of the present invention. By use of the above setting method, the SOC can be referred to based on the reset OCV and be reset faster with more accuracy. A detailed description of the data layout or table will be made with reference to FIG. 3 below.

Figure 3:
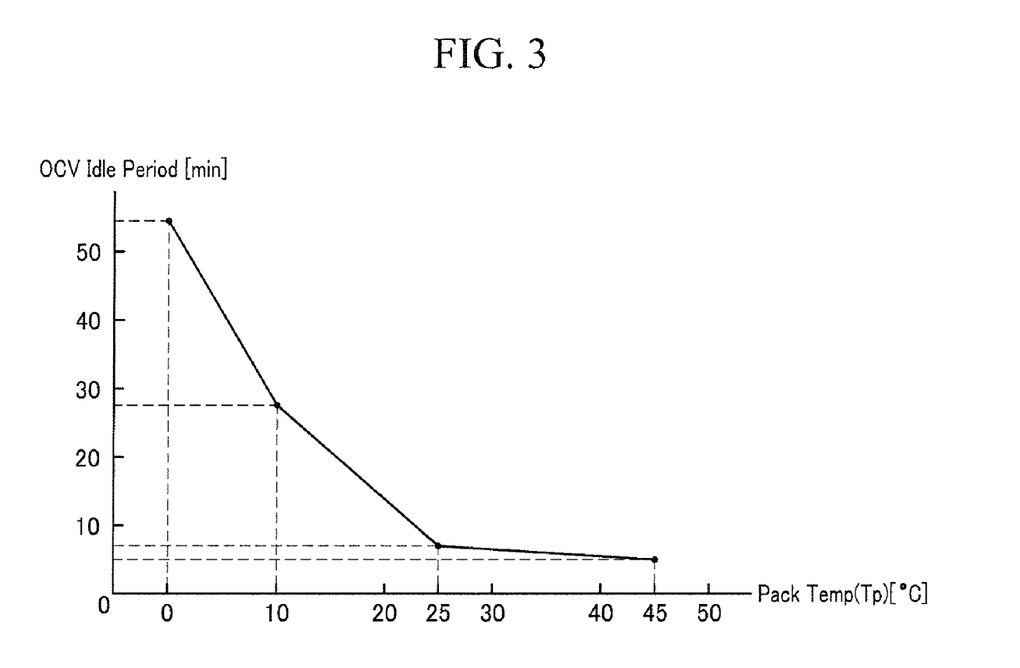
FIG. 3 is a graph illustrating a data table stored in an MCU according to an aspect of the present invention.

FIG. 3 is a graph illustrating the data table stored in the MCU 20 of the BMS 1 according to an aspect of the present invention. In the graph of FIG. 3, the vertical axis denotes the OCV idle period (in minutes), and a horizontal axis denotes the pack temperature (Tp) of the battery (in ° C.). The data table according to an aspect of the present invention shows data in terms of the OCV idle period and the pack temperature (Tp). Accordingly, the relationship between the pack temperature (Tp) and the OCV data is shown in a graph form. Nevertheless, in other aspects, the graph can be prepared using the cell peripheral temperature rather than the pack temperature (Tp). In various aspects, the information of the graph of FIG. 3 may be converted into a lookup table to be referred to.

An aspect of the experimental method to prepare the data table containing the OCV idle period and the pack temperature (Tp) is as follows.

After the charge and discharge of the battery 2 is completed, the OCV of the battery 2 was measured for three hours. The OCV that was obtained after the three hour period is defined as an actual OCV of the battery 2. During the three hours, the OCV of the battery 2 was measured and recorded every one minute. An SOC associated with the actual OCV (voltage at three hours after the charge and discharge was completed) was measured. Based on the SOC measurement, a $\Delta OCV$ (a difference of the OCV value) corresponding to a 1% margin of error of the measured SOC value was then calculated. Based on the calculation, the OCV that corresponded to a tolerance (or margin of error) of 1% of the SOC was calculated using the calculated $\Delta OCV$. A time taken to reach the calculated OCV was then defined as the OCV idle period. The process was repeated for a plurality of the pack temperature (Tp) and the OCV idle period was measured for each pack temperatures (Tp) to find all of the used data points.

The data table prepared based on the data measured in the experimental method is shown by the graph of FIG. 3.

As shown in the graph of FIG. 3, the OCV idle period decreases as the pack temperature (Tp) increases. This signifies that the OCV idle period is associated with a concentration of lithium ions. It can be appreciated that, as the temperature increases in the battery 2, the OCV idle period decreases due to an increase in the diffusion coefficient of the lithium ions. In other words, movement of the lithium ions is eased at higher temperatures, and is impeded at lower temperatures, which bear on the OCV and the SOC of the battery 2.

The SOC reset unit 300 compares time (battery idle time) during which the battery has not been charged and discharged with the OCV idle period received from the idle period decider 200. If the OCV idle period has lapsed based on the comparison result (that is, if the battery idle time is greater than or equal to the OCV idle period) the SOC reset unit 300 sets the pack voltage (Vp) received from the sensor 10 as the reset OCV Since the SOC reset unit 300 stores data representing a relationship of the OCV and the SOC, the SOC reset unit 300 detects and/or looks up an SOC that corresponds to the just reset OCV, and sets (or determines) the SOC that corresponds to the just set OCV as the reset SOC. Thereafter, the SOC reset unit 300 resets the estimated SOC as the reset SOC.

In another aspect, the estimation SOC decider 400 calculates the estimated SOC based on the pack current (Ip) received from the sensor 10 and a charging efficiency. The estimation SOC decider 400 calculates the estimated SOC using an actual charging efficiency ($\eta$) of the battery 2 as expressed in Equation 1 below:

$$SOC = \frac{\int (i \times \eta) dt}{TAC} \times 100[\%] \quad \text{(Equation 1)}$$

where $i$ is the charge and discharge current, which is the pack current (Ip) output from the sensor 10, $\eta$ is the actual charging efficiency of the battery 2, and $TAC$ is the total amount of charge.

In a non-limiting aspect of the present invention, the estimation SOC decider 400 receives the reset SOC from the SOC reset unit 300, and calculates the estimated SOC by accumulation, using the reset SOC.

A method of operating the BMS according to an aspect of the present invention will be described below.

Figure 4:
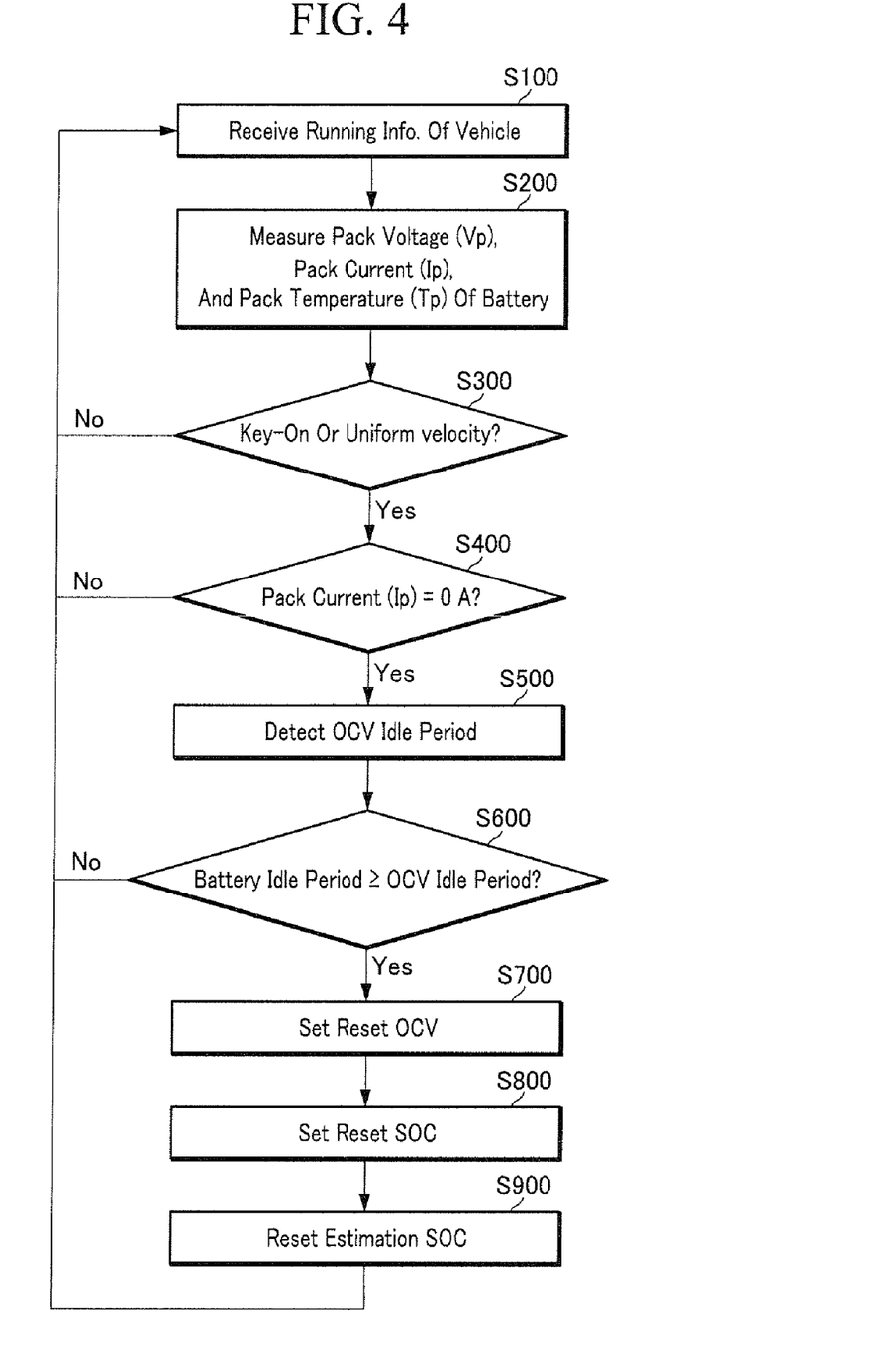
FIG. 4 is a flowchart illustrating a method of operating a BMS according to an aspect of the present invention.

FIG. 4 is a flowchart illustrating the method of operating the BMS 1 according to an aspect of the present invention.

As shown, the MCU 20 receives the running information of the vehicle from the communication unit 60 (operation S100). Then, the MCU 20 receives the pack voltage (Vp), the pack current (Ip), the pack temperature (Tp) of the battery, and/or the like, from the sensor 10 (operation S200). The controller 100 determines whether the running state is the key-on state or the constant velocity state depending on the running information of the vehicle (operation S300).

On the other hand, if the running state is determined to be the key-on state or the constant velocity state in operation S300, the controller 100 determines whether the pack current (Ip) is equal to 0 A (operation S400). If the pack current (Ip) is determined not to be equal to 0 A in operation S400, operation S100 is repeated.

On the other hand, if the pack current (Ip) is determined to be equal to 0 A in operation S400, the idle period decider 200 detects (or obtains) the OCV idle period associated with the pack temperature (Tp) (operation S500). However, if the pack current (Ip) is determined not to be equal to 0 A in operation S400, operation S100 is repeated.

The SOC reset unit 300 receives the battery idle period (the period the battery has been idle) and the OCV idle period from the controller 100 and the idle period decider 200, respectively, and determines whether the battery idle period is equal to or greater than the OCV idle period (operation S600). If the battery idle period is determined to be equal to or greater than the OCV idle period in operation S600, the SOC reset unit 300 sets the pack voltage (Vp) currently received from the sensor 10, as the reset OCV (operation S700). If the battery idle period is determined to be less than the OCV idle period in operation S600, operation S100 is repeated.

The SOC reset unit 300 then detects (or determines) the SOC associated with the just reset OCV, and sets (or replaces) the detected SOC as (or with) the reset SOC (operation S800). The SOC reset unit 300 transmits the just reset SOC to the estimation SOC decider 400, and resets the estimated SOC as the reset SOC (operation S900). When the reset of the estimated SOC is completed in operation S900, operation S100 is repeated. In other aspects, the estimation SOC decider 400 calculates the estimated SOC from accumulated reset SOC values in operation S900.

In the battery management system and the method of operating the same according to an aspect of the present invention, the OCV idle period is set differently depending on the pack temperature of the battery 2, the OCV is reset accordingly based on the OCV idle period and the pack temperature, the SOC is reset according to the reset OCV, and the estimated SOC is selectively reset as the reset SOC associated with the reset OCV. Accordingly, the SOC is reset far more frequently and accurately than compared with that of the related art.

When an engine is started and has been in the key-on state for only a short time relative to the last time the engine was stopped, it frequently happens in the related art that the OCV idle period is not fixed the SOC is not reset, and the estimated SOC is not accurate. However, in the battery management system and the method of operating the same according to an aspect of the present invention, even if the pack temperature is high and the OCV idle period is short, the OCV can be reset, and the initial SOC can be reset using the SOC associated with the reset OCV. Accordingly, more accurate SOC estimation is possible.

While not required in all aspects, elements of the method can be implemented as software and/or firmware for use with one or more processors and/or computers. Moreover a processor and/or computer readable medium maybe encoded with computer and/or processor-executable instructions for performing the method.

Additionally, although implemented as a battery management system of a vehicle, aspects of the present invention may be implemented with any rechargeable battery system.

In the battery management system and the method of operating the same according to aspects of the present invention, the SOC is reset with the OCV idle period that is differentiated depending on the temperature to thereby more frequently and accurately reset the SOC.

In the battery management system and the method of operating the same according to aspects of the present invention, the SOC can be more frequently set, to thereby reduce the margin of error in the estimated SOC and to more accurately estimate the SOC.

Although a few aspects of the present invention have been shown and described, it would be appreciated by those skilled in the art that changes may be made in aspects without departing from the principles and spirit of the invention, the scope of which is defined in the claims and their equivalents.

What is claimed is:

1. A battery management system that determines an estimated state of charge (SOC) of a battery, the system comprising:
    a sensor to sense a voltage, a current, and a temperature of the battery;
    a controller to determine whether the current flows, and to control a reset of an SOC depending on the determination result;
    an idle period decider to set an open circuit voltage (OCV) idle period associated with the detected temperature of the battery in response to an activation command of the controller; and
    an SOC reset unit to compare the set OCV idle period with a battery idle time during which the current of the battery does not flow, in response to the activation command of the controller, to set a reset OCV depending on the comparison result, and to selectively reset the estimated SOC as a reset SOC that corresponds to the reset OCV.

2. The system of claim 1, wherein the idle period decider stores a data table of the temperature of the battery and the OCV idle period, and determines the OCV idle period that corresponds to the received temperature of the battery from the stored data table.

3. The system of claim 2, wherein the data table comprises information on the reset OCV that corresponds to the temperature of the battery wherein the OCV was measured at a predetermined temperature of the battery after a predetermined time lapsed during which the current of the battery did not flow.

4. The system of claim 3, wherein the OCV is set as the reset OCV that corresponds to the SOC having a margin of error of 1%.

5. The system of claim 1, wherein the controller transmits the activation command to the SOC reset unit and the idle period decider to reset the SOC based on the determination that the current of the battery does not flow.

6. The system of claim 5, wherein when the current of the battery does not flow, the controller measures the battery idle time, and transmits the measured battery idle time to the SOC reset unit.

7. The system of claim 6, wherein the SOC reset unit sets the voltage of the battery to be the reset OCV when the received battery idle time is equal to or greater than the OCV idle period, and sets the SOC associated with the reset OCV as the reset SOC.

8. The system of claim 7, wherein the SOC reset unit stores data on the OCV relative to the SOC, and detects the reset SOC that corresponds to the reset OCV, from the data.

9. The system of any one of claim 1, further comprising an estimation SOC decider to calculate the estimated SOC.

10. The system of claim 9, wherein the estimation SOC decider accumulates the current of the battery, and selectively calculates the estimated SOC.

11. A method of operating a battery management system that has a plurality of battery cells constituting one pack, and that determines an estimated state of charge (SOC) of a battery having at least one pack, the method comprising:
measuring a temperature of the battery, and determining whether an electric current of the battery flows;
when the current of the battery is determined not to flow when measuring the temperature, detecting an open circuit voltage (OCV) idle period associated with the measured temperature of the battery;
measuring a battery idle time during which the current of the battery does not flow, and comparing the measured battery idle time with the detected OCV idle period;
when the determined battery idle time is equal to or greater than the detected OCV idle period, setting a voltage of the battery as a reset OCV; and
detecting an SOC associated with the reset OCV, and selectively resetting the estimated SOC using the detected SOC.

12. The method of claim 11, wherein the detecting of the OCV idle period includes detecting the OCV idle period associated with the temperature of the battery from a data table of the temperature of the battery relative to the OCV idle period.

13. The method of claim 12, wherein the data table comprises information on the reset OCV that corresponds to the temperature of the battery, wherein the OCV was measured at a predetermined temperature of the battery after a predetermined time lapsed during which the current of the battery did not flow.

14. The method of claim 13, wherein the OCV is set as the reset OCV that corresponds to the SOC having a margin of error of 1%.

15. A battery management system to output an estimated state of charge (SOC) of a battery to a motor control unit (MTCU) of a vehicle, the system comprising:
a sensor to sense a current, a voltage, and a temperature of the battery;
a main control unit (MCU) to reset the estimated SOC using the sensed current, voltage, and temperature received from the sensor, and to control a charge and discharge of the battery; and
a communication unit to transmit the SOC output from the MCU to the MTCU, and to receive running information of the vehicle from the MTCU,
wherein the MCU comprises:
a controller to receive the running information of the vehicle, and, when the vehicle is in a key-on state or a constant velocity state, to determine whether the current of the battery flows, and to control a reset of the SOC depending on the determined result,
an idle period decider to set an OCV idle period that corresponds to the temperature of the battery in response to an activation command of the controller, and
an SOC reset unit to compare the set idle period with a battery idle time during which the current of the battery does not flow, in response to the activation command of the controller, to set a reset OCV depending on the comparison result, and to selectively reset the estimated SOC as a reset SOC that corresponds to the reset OCV.

16. The system of claim 15, wherein the idle period decider stores a data table of the temperature of the battery and the OCV idle period, and determines the OCV idle period that corresponds to the received temperature of the battery from the stored data table.

17. The system of claim 16, wherein the data table comprises information on the reset OCV that corresponds to the temperature of the battery, wherein the OCV was measured at a predetermined temperature of the battery after a predetermined time lapsed during which the current of the battery did not flow.

18. The system of claim 17, wherein the OCV is set as the reset OCV that corresponds to the SOC having a margin of error of 1%.

19. A battery management method to determine a state of charge of a rechargeable battery, comprising:
detecting an amount of time the rechargeable battery has been idle;
detecting a temperature and a voltage of the rechargeable battery;
obtaining a predetermined minimum idle time to stabilize the rechargeable battery that corresponds to the detected temperature of the rechargeable battery;
determining whether the detected rechargeable battery idle time is greater than or equal to the minimum idle time;
setting the detected voltage of battery as a present open circuit voltage of the rechargeable battery based on the determination that the detected rechargeable battery idle time is greater than or equal to the minimum idle time; and
setting the state of charge of the rechargeable battery that corresponds to the detected voltage as the present state of charge of the rechargeable battery.

20. The battery management method of claim 19, wherein the method is performed when the rechargeable battery is idled by not having a current flow into or out of the rechargeable battery.

* * * * *